United States Patent
Hurwitz et al.

(10) Patent No.: US 9,673,063 B2
(45) Date of Patent: Jun. 6, 2017

(54) TERMINATIONS

(71) Applicant: Zhuhai Advanced Chip Carriers & Electronic Substrate Solutions Technologies Co. Ltd., Zhuhai (CN)

(72) Inventors: Dror Hurwitz, Zhuhai (CN); Alex Huang, Zhuhai (CN)

(73) Assignee: Zhuhai Advanced Chip Carriers & Electronic Substrate Solutions Technologies Co. Ltd., Zhuhai (CN)

( * ) Notice: Subject to any disclaimer, the term of this patent is extended or adjusted under 35 U.S.C. 154(b) by 0 days.

(21) Appl. No.: 14/922,708

(22) Filed: Oct. 26, 2015

(65) Prior Publication Data

US 2017/0117161 A1 Apr. 27, 2017

(51) Int. Cl.
*H01L 23/48* (2006.01)
*H01L 21/48* (2006.01)
*H01L 23/498* (2006.01)
*H01L 21/60* (2006.01)

(52) U.S. Cl.
CPC ...... *H01L 21/4853* (2013.01); *H01L 21/4857* (2013.01); *H01L 23/49822* (2013.01); *H01L 23/49838* (2013.01); *H01L 2021/60022* (2013.01)

(58) Field of Classification Search
CPC ............ H01L 2924/01079; H01L 2224/13099
USPC .......................................... 257/737; 438/125
See application file for complete search history.

(56) References Cited

U.S. PATENT DOCUMENTS

| | | | | |
|---|---|---|---|---|
| 2007/0222054 A1* | 9/2007 | Hembree | ............. | H05K 3/4046 257/686 |
| 2008/0029858 A1* | 2/2008 | Merilo | ................ | H01L 23/3128 257/668 |
| 2013/0319738 A1* | 12/2013 | Hurwitz | ............ | H01L 23/49827 174/257 |
| 2014/0167234 A1* | 6/2014 | Hurwitz | ................ | H01L 21/563 257/668 |

OTHER PUBLICATIONS

Kim et. al, "Formation of of three-dimensional Parylene C structures via thermoforming" J. Micromech. Microeng. 24 (2014) 065003 (9pp).*

* cited by examiner

*Primary Examiner* — Jami M Valentine
(74) *Attorney, Agent, or Firm* — Wiggin and Dana LLP; Gregory S. Rosenblatt

(57) ABSTRACT

An electronic support structure comprising one or more layers of copper features such as copper routing layers, laminated within a dielectric material comprising continuous glass fibers in a polymer matrix wherein pairs of adjacent layers of copper features are coupled by a via layer, and where terminations on at least one side of the electronic support structure comprise a modified bond-on-trace attachment sites comprising selectively exposed top and partial side surfaces of copper features in an outer layer of copper features for conductive coupling solder.

18 Claims, 2 Drawing Sheets

TERMINATIONS

BACKGROUND

Field of the Invention

The present invention relates to terminations for multilayer electronic support structures such as interposers, and to methods of manufacturing of same.

Description of the Related Art

Driven by an ever greater demand for miniaturization of ever more complex electronic components, consumer electronics such as computing and telecommunication devices are becoming more integrated. This has created a need for support structures such as IC substrates and IC interposers that have a high density of multiple conductive layers and vias that are electrically insulated from each other by a dielectric material.

The general requirement for such support structures is reliability and appropriate electrical performance, thinness, stiffness, planarity, good heat dissipation and a competitive unit price.

Among the high density leading technologies used to interconnect the Substrate to Chips is the well-established "Flip Chip" technology, in which solder bumps, lead-free solder bumps, or copper bumps having solder or lead-free solder on their tips, are grown on the chip terminating pads and the chip is then flipped over to interconnect its bumps with the pads on the top surface of the substrate. As chip bumps and pitches become denser, advanced substrates are sometimes equipped with bumps of their own to assist with the interconnection to the chip bumps. Such bumps on the substrate pads are also known as "SoP" (Solder on Pad") bumps—and usually consist of solder or lead-free solder. The SoP bumps are generally applied to the substrate terminating pads by stencil printing followed by reflow, or by electroplating processes followed by reflow or by solder balls dropped onto substrate fluxed pads. Such bumps are usually "coined" by applying heat and pressure to generate a top flat surface on the bumps, which can assist with the placement of the bumps from the die side.

A minimum bump array pitch on the substrate of 140 µm to 150 µm is currently used for solder bumps in many applications, and 50 µm to 60 µm pitch that correspond with the introduction of 14 nm node silicon are anticipated to be needed.

Generating solder bumps on the substrate in ever tighter pitches is tricky in that the current methods of stencil printing, solder ball drops or solder bump electro plating are required to be more and more accurate and more expensive in order to overcome the risk of shorting between nearby connections at the finer pitches.

U.S. Pat. No. 9,049,791 to Hurwitz and Huang titled "Novel Terminations and Couplings Between Chips and Substrates" and filed on 7 Jun. 2013 discloses a multilayer composite electronic structure comprising at least one pair of feature layers extending in an X-Y plane, each adjacent pair of feature layer being separated by an inner via layer, the via layer comprising via posts that couple adjacent feature layers in a Z direction perpendicular to the X-Y plane, the via posts being embedded in an inner layer dielectric, the multilayer composite structure further comprising terminations consisting of an outer layer of via pillars embedded in an outer dielectric material, thinned to expose the ends of the outer layer of via pillars.

U.S. Ser. No. 13/912,652 to Hurwitz teaches copper via posts that are embedded in dielectric and then thinned so that the ends of the copper via posts are flush with the surface of the dielectric. Typically, the thinned outer layer of via pillars with exposed ends embedded in an outer dielectric material that is substantially planar with a roughness of less than 3 microns and the exposed outer layer of via pillars is interconnectable with flip chip bumps. The ends of the via pillars which are flush with the dielectric in which they are embedded, may be connected to the flip chip bumps by a solderable metal through reflow or by a Z-conductive anisotropic adhesive material.

It will be appreciated that the contact area between the solder bumps and the copper via posts is limited to the cross-sectional area of the copper via posts. All the contacts are in a single plane. This leads to a certain susceptibility of disconnected contacts and electrical open failures.

U.S. Ser. No. 14/150,683 to Hurwitz and Huang titled "Substrates with Ultra Fine Pitch Flip Chip Bumps" filed on 8 Jan. 2014 describes a different approach. Here a multilayer composite electronic structure comprising feature layers extending in an X-Y plane is again described, wherein each adjacent pair of feature layers is separated by an inner via layer that comprises via posts that couple adjacent feature layers in a Z direction perpendicular to the X-Y plane, the via posts being embedded in an inner layer dielectric. In the structures disclosed, the multilayer composite structure further comprises at least one outer layer of terminations comprising at least one micro bump wherein the at least one micro bump comprises a via pillar capped with a solderable material. The solderable material on the micro bump fuses with the solder bumps of the flip chip package to be attached to the chip. This provides additional solderable material and aids adhesion. This solution is somewhat more expensive than other termination technologies because of the additional processing and the different compositions of solderable materials that are required.

U.S. Ser. No. 14/163,084 to Hurwitz and Huang titled "Substrates with Protruding Copper Termination Posts" was filed on 24 Jan. 2014. It teaches a multilayer composite electronic structure comprising feature layers extending in an X-Y plane, each adjacent pair of feature layers being separated by an inner via layer, the via layer comprising via posts that couple adjacent feature layers in a Z direction perpendicular to the X-Y plane, the via posts being embedded in an inner layer dielectric, the multilayer composite structure further comprising at least one outer layer of terminations comprising a two dimensional array of copper posts that is only partially embedded in an outer layer of dielectric such that part of each copper post protrudes beyond surface of the outer layer of dielectric.

This approach enables enhanced bonding, in that solder bumps of a chip may coat and bond with not just the top surface of the protruding ends but also the protruding side walls thereof. This provides a larger surface area for bonding and also since the solder—post interface is not linear, it is less likely to simply shear and fail. This approach also supports the copper pillar adhesion level to the substrate since it is anchored to the substrate at its base as well as by the non-protruding side walls. Nevertheless, due to the relatively large thickness of copper pillars as compared to the conductor layer and since each of the copper pillars must be accurately aligned on an underlying conductor layer, such pillars are subject to separation spacing limitations that can adversely affect their application in tight pitch flip chip devices. Furthermore, it will be appreciated that an additional copper pillar layer increases the number of process steps required for manufacturing such substrates thereby increasing fabrication costs and lowering yields.

Despite the various developments with interposer terminations, there is a constant drive towards tighter pitch conductors with terminations to which flip chip devices can be attached by solder bumps avoiding additional structures such as copper pillars which would require additional processing and alignment steps and add undesirable thickness.

BRIEF SUMMARY

The present invention is directed to novel terminations that enable lower cost, higher yield, more reliable interposers and multilayer support structures with tighter pitch.

A first aspect is directed to an electronic support structure comprising an underlying structure, an outer via layer and a layer of copper features such as a copper routing layer, the outer via layer and an inner part of the layer of copper features being laminated within a dielectric material, an outer part of the layer of copper features protruding beyond the dielectric material.

Typically, the outer part of the layer of copper features protruding beyond the dielectric material is coated with Organic Solderability Preservative OSP.

Preferably the outer part of the layer of copper features protruding beyond the dielectric material protrudes at least 5 microns beyond the dielectric material.

Preferably the layer of copper features is partially embedded in the dielectric material to a depth of at least 5 microns.

Typically the dielectric material comprises a polymer matrix.

Typically the polymer matrix comprises a polymer resin selected from the group of thermosets and thermoplastics.

Typically the dielectric material further comprises glass fibers.

Typically the dielectric material further comprises inorganic fillers.

Typically terminations on at least one side of the electronic support structure comprise modified bond-on-trace attachment sites comprising selectively exposed top and partial side surfaces of copper features in an outer layer of copper features as sites for conductive coupling using solder.

Typically, side surfaces of the outer part of the outer copper feature protrude from the dielectric material by at least 5 microns for wetting by solder to facilitate attachment of an IC chip.

Typically, the electronic support structure of claim 1 comprising an interposer.

Typically the underlying structure comprises a layer of terminations.

Optionally, the underlying structure comprises at least one additional feature layer.

Optionally, the underlying structure comprises at least one additional via layer.

A second aspect is directed to a method of attaching an IC chip to an electronic support structure as described, comprising selectively removing Organic Solderability Preservative OSP if present, and coupling the chip by flip chip technology directly to the outer layer of features, such that solder from the chip terminations engages the top and part of the exposed side surfaces of the outer layer of features, enabling strong anchoring.

Optionally, the exposed features are exposed by selective plasma ablation of the dielectric matrix.

Throughout, the term microns or μm refers to micrometers, or $10^{-6}$ m.

BRIEF DESCRIPTION OF THE DRAWINGS

For a better understanding of the invention and to show how it may be carried into effect, reference will now be made, purely by way of example, to the accompanying drawings.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention; the description taken with the drawings making apparent to those skilled in the art how the several forms of the invention may be embodied in practice. In the accompanying drawings.

DETAILED DESCRIPTION

In the description hereinbelow, support structures consisting of metal vias in a dielectric matrix, particularly, copper via posts in a polymer matrix, such as polyimide or epox-y or BT (Bismaleimi de/Triazine) or their blends. Such dielectrics may be reinforced with glass fibers and applied as prepregs. Other embodiments use other thermoplastic or thermoset polymers.

Figure 1:
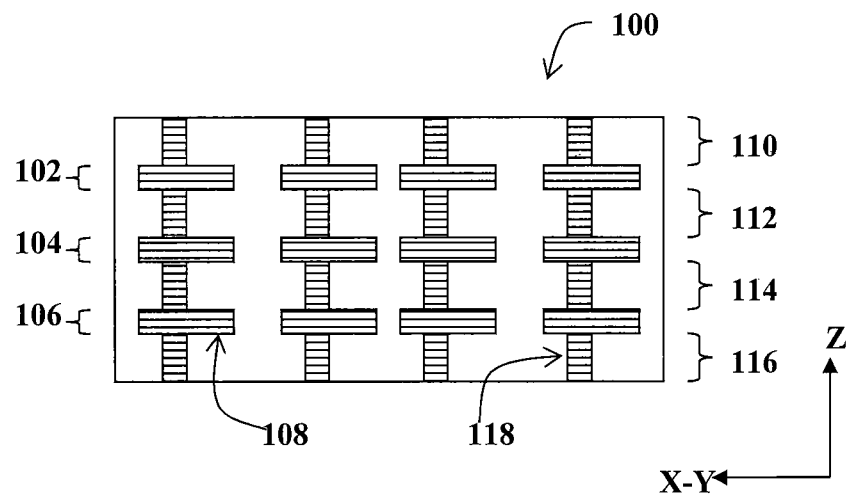
FIG. 1 is a simplified a schematic section through a multilayer composite support structure of the prior art.

FIG. 1 is a simplified section through a multilayer composite support structure of the prior art. As described in U.S. Pat. No. 7,682,972, U.S. Pat. No. 7,669,320 and U.S. Pat. No. 7,635,641, for example, multilayer support structures 100 of the prior art include functional layers 102, 104, 106 of components or features 108 separated by layers of dielectric 110, 112, 114, 116, which insulate the individual layers. Vias 118 through the dielectric layer provide electrical connection between features 108 in the adjacent functional or feature layers 102, 104, 106. Thus the feature layers 102, 104, 106 include features 108 generally laid out within the layer, in the X-Y plane, and vias 118 that conduct current across the dielectric layers 110, 112, 114, 116. Vias 118 are generally designed to have minimal inductance and are sufficiently separated to have minimum capacitances therebetween.

Typically, a chip is appended to one side of the multilayer composite support structure, and the other side is coupled to a printed circuit board PCB.

Figure 2:
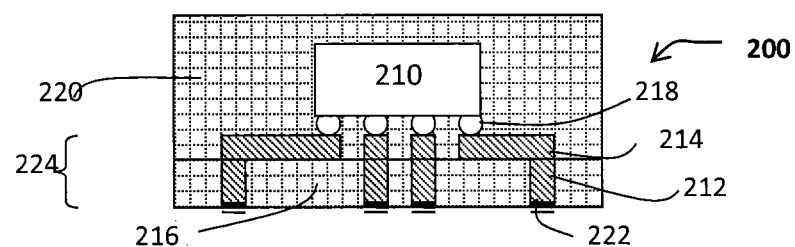
FIG. 2 is a simplified a schematic section through a prior art chip package comprising a chip attached to a routing layer by solder balls the whole embedded in dielectric, and terminations comprising a layer of posts that are embedded in dielectric and have ends flush with the dielectric that are protected with termination material such as nickel, gold, tin, lead, tin-lead alloy, silver, palladium and alloys thereof.

With reference to FIG. 2, an ultra thin package 200 consisting of a chip 210 coupled directly in a 'flip chip' configuration to a fan-out routing layer 214 by an array of solder bumps 218 is shown. The chip 210, solder bumps 218 and the routing layer 214 are all embedded in a dielectric 220 comprising a polymer matrix which may be reinforced with glass fibers. The ultra thin package 200 has terminations for coupling to a printed circuit board PCB or the like. The terminations are vias 212 coated with termination material 222 such as nickel, gold, tin, lead, tin-lead alloy, silver, palladium and alloys thereof. The vias are embedded in a dielectric 216 comprising a polymer matrix which may be reinforced with glass fibers. The structure of FIG. 2 is described in U.S. Pat. No. 8,866,286 titled "single Layer Coreless Substrate" to Hurwitz et al.

By coupling the IC chip 210 directly to the routing layer 214 by solder bumps 218 on the IC Chip 210, a layer of via posts between the routing layer 218 and the IC chip 210 is avoided. This avoids additional manufacturing steps, reducing manufacturing costs, and also minimizes the thickness of the package 200.

The coupling of the chip 210 to the fan-out routing layer 214 by the array of solder bumps 218 is a type of coupling known as "Bond-on-Trace" (BoT). Each of the solder bumps 218 is couples to the top surface of the routing layer 214. The type of bond-on-Trace BoT solution shown where routing layer 214 rests on the surface of the dielectric 216 is known as 'extended trace'. It has a problem in that the traces (i.e. the routing layer 214) are not tightly bonded to the underlying dielectric 216 and the poor adhesion may resulting in the traces peeling off during curing of the underlying dielectric 216 after flip chip coupling by the solder bumps 218, prior to applying the dielectric 220 that coats the chip IC 210.

It will be appreciated that extended trace reliability becomes more difficult to achieve as the FC pitch becomes smaller since the conductive lines have to be smaller. Thus the adhesion strength of routing layer 214 with, say, 10 micron lines, is much more of an issue than where the lines are, say 20 micron wide, since the contact area between routing layer 214 and dielectric 216 is much less. Furthermore, the wetting and bonding of the solder bumps 218 with the traces or features 214 is only with the top surface of the traces of features 214, and so the solder to trace (feature) bonding is not strong.

There is another type of Bond-on-Trace "BoT" known as 'Embedded Trace' where not just the base, but also the edges of the trace are surrounded with the dielectric 216, the top surface being flush with the top surface of the dielectric, or slightly submerged (0 μm to 5 μm). With embedded traces, the likelihood of conductor peel off is minimized, however the smaller the trace becomes, the more critical it is for the trace to be flush to surface since the low amount of solder coming from the solder bump on the flip chip tip is usually not enough to wet its surface and penetrate through even the small cavity between the trace and pre-preg.

Figure 3:
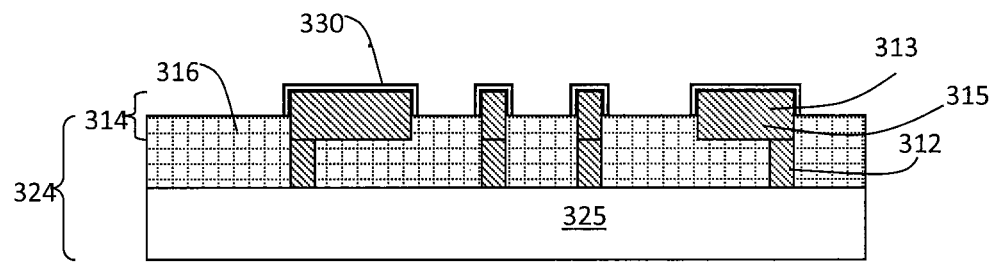
FIG. 3 is a simplified a schematic section showing how the routing layer of an interposer may protrude partly above the surrounding dielectric and be protected with Organic Solderability Preservative OSP.

With reference to FIG. 3, a substrate 324 which may be an interposer or other multi-layer support structure is shown. Of interest are the outer layer of vias 312 and features 314 only. Remaining layers 325 are not shown in any detail. Remaining layers 325 typically comprise terminations for coupling to a printed circuit board and one or more layers of features separated by via layers.

The outer most via layer 312 is covered with a feature layer 314. Unlike feature layer 214 in FIG. 2 which is an extended Bond-on-Trace, feature layer 314 is partially submerged in dielectric 316. The feature layer 314 is at least 10 microns thick, and at least 5 microns of the features of feature layer 314 are embedded in the dielectric 316 and at least 5 microns protrude above the dielectric 316.

The embedded part 315 of the features in the feature layer 314 together with the bottom surface of the features which also contacts the dielectric 316 provide anchoring to the dielectric 316 and prevent the features of the feature layer 314 from peeling away. The protruding part 313 of the feature layer 314 that protrudes above the dielectric 316 is typically coated with Organic Solderability Preservative (OSP) 330, which is a water-based organic compound.

The interposer 324 consists of remaining layers 325 and an outer layer of vias 312 covered with an outer layer of features 314 that may be a routing layer. The outer layer of vias 312 and part of the outer layer of features 315 are embedded in a dielectric 316 comprising a polymer matrix which may be reinforced with glass fibers. The outermost part 313 of the outer layer of features 314 are exposed and protrude over the dielectric material 316. This may be achieved by mechanically, chemically or mechanically-chemically polishing away the outermost structure to expose the top of the copper and then further plasma etching away the outer layer of dielectric 316, for example. There are a variety of plasma etching regimes that may be used. By way of non-limiting example, one such regime is to use a Carbon tetrafloride oxygen mix in the range $CF4:O_2$ of between about 65:35 and about 1:20 at a power of about 4 KW and a pressure in the range of about 0.1-4 torr.

Alternatively, the outer feature layer 313 and outer via layer could be fabricated on a sacrificial substrate by pattern plating and laminating, and then the remaining layers 325 could be built up thereover. After the sacrificial substrate is stripped away, part of the dielectric surrounding the outer feature layer 314 may be removed leaving an outermost part of the feature layer 313 protruding and a lowermost part of the feature layer 315 embedded in dielectric 316.

The protruding parts 313 of the via layer 314 may be coated with an organic solder preservative OSP 330 which is a water-based organic compound that selectively bonds to copper and protects the copper from oxidizing prior to soldering.

Figure 4:
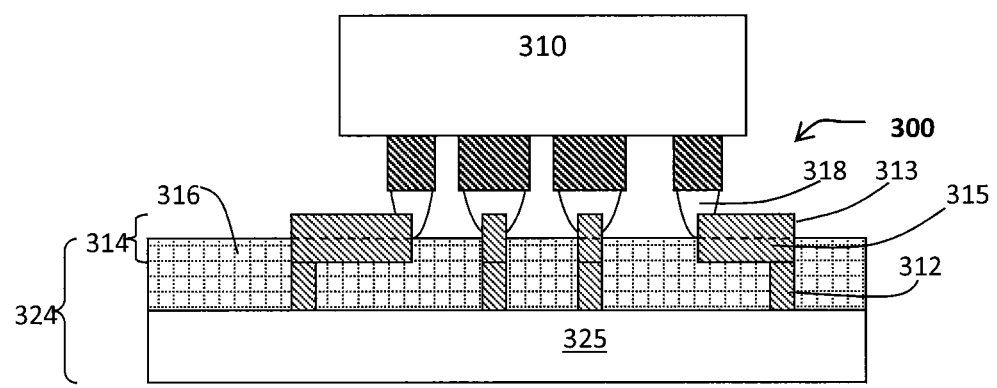
FIG. 4 is a schematic a simplified a schematic section showing how the routing layer of an interposer protruding partly above the surrounding dielectric may be stripped of its Organic Solderability Preservative OSP, and may enable enhanced binding of an IC thereto via solder balls that not only contact the uppermost surface of the routing layer, but flow over and around the protruding routing layer, bonding to the partially exposed side walls thereof, enabling stronger bonding.

With reference to FIG. 4, after removing the after removal of Organic Solderability Preservative (OSP) 330, a chip 310, such as an IC may be coupled to the protruding parts 313 of the outer feature layer 314 with solder bumps 318. Since the sides of the protruding part 313 are free from dielectric 316, the solder balls 318 can flow and adhere to the exposed parts of the side walls and not just to the upper surface of the features of the feature layer 314 and, due to the combination of larger contact area and the fact that there is no simply shear line, the solder—feature adhesion of the terminations of the structure shown 300 in FIG. 4 is superior to that of embedded or adhered bond on trace as known, where the solder bumps 218 contact the outer surface of the feature layers 214 only. Consequently, even without subsequent encapsulation (such as that shown in FIG. 2) the chip 310 is firmly bonded to the outer feature layer 314.

It will be appreciated that by coupling the IC chip 310 directly to the routing layer 314 by solder balls 318, a layer of via posts between the routing layer and the IC chip is avoided. This avoids additional manufacturing steps, reducing manufacturing costs, and also minimizes the thickness of the interposer 324.

One manufacturing technique is to use plasma to remove part of the surrounding dielectric 316 from an embedded routing layer, leaving part of the routing layer 315 embedded for anchoring purposes and part of the routing layer 313 protruding above the dielectric 316. If the routing layer 314 is deposited on a sacrificial substrate such as a copper plate, the routing layer and underlying via layer 312 may be fabricated by electroplating into patterned photoresist, followed by lamination with the dielectric 316, either as prepreg or polymer sheet. After the underlying structure 325 is formed, the sacrificial substrate may be removed and then plasma may be used to remove part of the dielectric 316 exposing the outer part 313 of the routing layer 315.

Other ways of fabricating partially protruding feature layers may be possible. For example, In U.S. Pat. No. 8,997,342 to Hurwitz and Huang titled "Method of fabrication, A Multilayer Electronic Structure and Structures in Accordance with the Method"; a method of fabricating a multilayer support structure is detailed. In that patent, use of a release film having a hardness that is harder that the resin of a pre-preg but softer than the cured resin is discussed. It may be possible to fabricate the structure of FIG. 4 by modifying the method of U.S. Pat. No. 8,997,342 to only partially laminating the routing layer 314 by applying one instead of two sheets of prepregs, for example.

It will be particularly appreciated that by using the double press pad concept described in U.S. Pat. No. 8,997,342, the dielectric thickness can be maintained within a range of +−3 microns.

Persons skilled in the art will appreciate that the present invention is not limited to what has been particularly shown and described hereinabove. Rather the scope of the present invention is defined by the appended claims and includes both combinations and sub combinations of the various features described hereinabove as well as variations and modifications thereof, which would occur to persons skilled in the art upon reading the foregoing description.

In the claims, the word "comprise", and variations thereof such as "comprises", "comprising" and the like indicate that the components listed are included, but not generally to the exclusion of other components.

What is claimed is:

1. An electronic support structure comprising an underlying structure, the underlying structure comprising copper feature layers coupled together by perpendicular copper vias, the copper features and vias being embedded in a dielectric material having a polymer matrix and having an outer via layer conductively coupled to a surface routing layer, an inner part of the surface routing layer embedded within the dielectric material and an outer part of the surface routing layer of copper features protruding beyond the dielectric material.

2. The electronic support structure of claim 1 wherein the outer part of the layer of copper features protruding beyond the dielectric material is coated with Organic Solderability Preservative OSP.

3. The electronic support structure of claim 1 wherein the outer part of the layer of copper features protruding beyond the dielectric material protrude at least 5 microns beyond the dielectric material.

4. The electronic support structure of claim 1 wherein the layer of copper features is partially embedded in the dielectric material to a depth of at least 5 microns.

5. The electronic support structure of claim 1 wherein the dielectric material comprises a polymer matrix.

6. The electronic support structure of claim 1 wherein the polymer matrix comprises a polymer resin selected from the group of thermosets and thermoplastics.

7. The electronic support structure of claim 5 wherein the dielectric material further comprises glass fibers.

8. The electronic support structure of claim 5 wherein the dielectric material further comprises inorganic fillers.

9. The electronic support structure of claim 1 where terminations on at least one side of the electronic support structure comprise modified bond-on-trace attachment sites comprising selectively exposed top and partial side surfaces of copper features in an outer layer of copper features as sites for conductive coupling using solder.

10. The electronic support structure of claim 1 wherein side surfaces of the outer part of the outer copper feature protrude from the dielectric material by at least 5 microns for wetting by solder to facilitate attachment of an IC chip.

11. The electronic support structure of claim 1 comprising an interposer.

12. The electronic support structure of claim 1 wherein the underlying structure comprises a layer of terminations.

13. The electronic support structure of claim 1 wherein the underlying structure comprises at least one additional feature layer.

14. The electronic support structure of claim 13 wherein the underlying structure comprises at least one additional via layer.

15. A method of attaching an IC chip to an electronic support structure of claim 1 comprising selectively removing Organic Solderability Preservative OSP if present, and coupling the chip by flip chip technology directly to the outer part of the outer layer of features, such that solder from the chip terminations engages the top and part of the exposed side surfaces of the outer part of the outer layer of features, enabling strong anchoring.

16. The method of claim 15, wherein the outer part of the outer layer of features is exposed by selective plasma ablation of the dielectric matrix.

17. An electronic support structure comprising an underlying structure comprising copper feature layers coupled together by perpendicular copper vias, the copper features and vias being embedded in a dielectric material having a polymer matrix and having an outer via layer conductively coupled to a surface routing layer which extends in a plane perpendicular to the vias, the copper features and vias being embedded in a dielectric material having a polymer matrix, an inner part of the surface routing layer embedded within the dielectric material and an outer part of the surface routing protruding beyond the dielectric material and wherein the outer part of the surface routing layer is coated with Organic Solderability Preservative OSP.

18. An electronic support structure comprising an underlying structure comprising copper feature layers coupled together by perpendicular copper vias, the copper features and vias being embedded in a dielectric material having a polymer matrix and having an outer via layer conductively coupled to a surface routing layer which extends in a plane perpendicular to the vias, the copper features and vias being embedded in a dielectric material having a polymer matrix wherein an inner part of the surface routing layer of copper features is embedded within the dielectric material and an outer part of the surface routing layer of copper features protrudes beyond the dielectric material, wherein at least one of the following limitations is true:
   (i) terminations on at least one side of the electronic support structure comprise modified bond-on-trace attachment sites comprising selectively exposed top and partial side surfaces of copper features in an outer layer of copper features as sites for conductive coupling using solder;

(ii) side surfaces of the outer part of the outer copper feature protrude from the dielectric material by at least 5 microns for wetting by solder to facilitate attachment of an IC chip.

\* \* \* \* \*